United States Patent [19]

Brewer et al.

[11] Patent Number: 5,298,759
[45] Date of Patent: Mar. 29, 1994

[54] PHOTO-CRACKER CELL

[75] Inventors: Peter D. Brewer, Newbury Park; John A. Roth, Ventura, both of Calif.

[73] Assignee: Hughes Aircraft Company, Los Angeles, Calif.

[21] Appl. No.: 19,965

[22] Filed: Feb. 19, 1993

[51] Int. Cl.$^5$ .............................................. G21K 5/00
[52] U.S. Cl. ............................... 250/492.1; 427/561; 427/568; 118/722
[58] Field of Search .................. 250/492.1; 427/561, 427/568, 582, 583, 562, 563, 564; 118/722

[56] References Cited

U.S. PATENT DOCUMENTS 4,710,638 12/1987 Wood .............................. 250/492.1
5,144,146 9/1992 Wekhof .......................... 250/492.1

Primary Examiner—Jack I. Berman
Attorney, Agent, or Firm—V. D. Duraiswamy; W. K. Denson-Low

[57] ABSTRACT

Ultraviolet (UV) light from a lamp (12) or laser (38) is provided for cracking Group V and Group VI species comprising clusters (dimers and tetramers) or metal-organic molecules to form monomers (atoms). The UV radiation interacts with a molecular beam (14) of Group V and Group VI species following their generation in a source cell (16), which may be an effusion source in molecular beam epitaxy (MBE) apparatus, a thermal cracker cell in gas-source MBE apparatus, or a gas injector cell in metal-organic MBE apparatus (MOMBE). As configured, the UV light source and associated elements comprise a unit, termed herein a "photo-cracker cell" (10). The photo-cracker cell includes an elliptical reflective cavity (18), which defines two foci. The source of UV light is located along one focus and the path of the molecular beam is located along the other focus substantially parallel thereto. The photo-cracker cell may be provided on existing MBE or MOMBE apparatus, between the present source cell and the growth chamber (36) in which III-V, IV, and II-VI semiconductor layers on substrates are deposited.

26 Claims, 3 Drawing Sheets

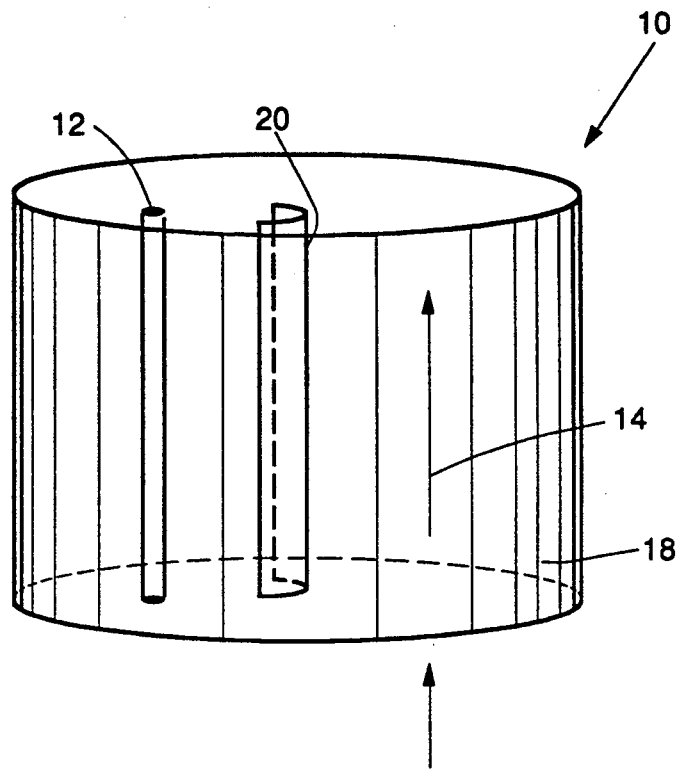
FIG. 1.
FIG. 2.
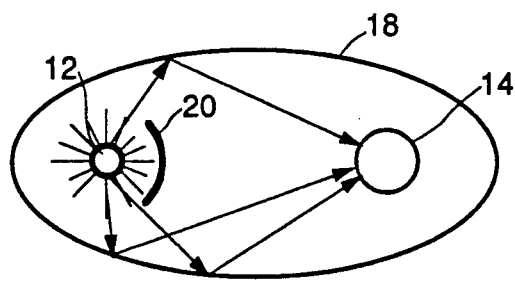

PHOTO-CRACKER CELL

BACKGROUND OF THE INVENTION

1. Field of the Invention

The present invention relates to molecular beam epitaxial formation of semiconductor layers, and, more particularly, to a method for generating source beams having a high fractional content of monomeric (atomic) species.

2. Description of Related Art

Molecular beam epitaxy (MBE) is an ultrahigh vacuum technique for depositing single crystal semiconducting, insulating, and metallic materials. The advantages of MBE over other growth techniques include the ability to produce high purity materials with precise control of composition, layer thickness, and dopant (impurity) concentrations. In MBE, growth is achieved by directing "molecular" beams of the desired constituents onto a heated substrate in an ultrahigh vacuum chamber. These source beams traditionally are formed by heating a small reservoir that contains the relevant material in solid form so that sublimation or evaporation occurs. The design of the crucible that holds the source material, in conjunction with apertures external to the crucible, result in a directed beam of neutral molecules that impinge on the substrate at a rate that is controlled by the crucible temperature.

Thermal "effusion" sources of the type just described produce, in general, a mixture of both atoms and molecules that contain the atomic species of interest. Sources for elements from columns II, III, and IV of the Periodic Table tend to produce primarily atoms, whereas sources for elements from columns V and VI contain primarily tetramer (4-atom) and dimer (2-atom) clusters. Since the growth of a crystalline layer at the substrate surface ultimately requires individual atoms, dimers and tetramers must somehow be separated into atoms in order for epitaxial growth to occur.

Current practice relies on thermal energy from the substrate to "crack" the clusters on the surface and thereby separate them into individual atoms. However, this surface cracking process is very temperature dependent, and can be quite inefficient, requiring large excess incident fluxes of molecules to achieve the required incorporation of the species of interest. In some cases, it is not possible to find a substrate temperature at which all the necessary atomic species are efficiently produced at the surface, and thus it is essentially impossible to grow certain materials using conventional thermal effusion sources. An example of this type of limitation occurs in the growth of III-V ternary alloys containing two Group V constituents, such as $GaAs_xSb_{1-x}$. MBE growth of these materials using conventional thermal sources for As and Sb has been largely unsuccessful due to an inability to control the relative proportions of the Group V elements in the crystal. This problem is directly linked to the molecular nature of the sources and their consequent inefficient incorporation into the growing crystal. The availability of atomic sources for As and Sb would eliminate the problem and permit the growth of high quality crystals of such materials.

The problem of non-atomic source beams has been recognized in the past, and some improvement has been achieved by adding a high-temperature "cracking" tube at the output of a conventional thermal effusion cell in order to achieve some conversion of tetramers to dimers. This has improved the control of MBE growth of crystals containing Group V species, but does not approach the level that could be achieved using pure monomeric (atomic) beams. In principle, if the cracking tube could be operated at a sufficiently high temperature, then the complete reduction of clusters to atoms would occur. However, in practice, the high temperatures required to produce a substantial atomic fraction from such a source are incompatible with the ultrahigh vacuum growth environment required to produce high purity crystals. For this reason, thermal cracker cells are usually employed only to reduce tetramers to dimers, and are not effective for producing beams that are substantially monomeric.

MBE is also practiced in another form in which gaseous sources are used instead of or in addition to effusion cells to form the source beams. Sources for gas-phase MBE, including metal-organic MBE (MOMBE), are typically metal organic or metal hydride molecules. Thermal dissociation of the molecules on the growth surface is usually relied upon to liberate the metal atoms. However, the thermal dissociation reaction is often very inefficient at the desired substrate (growth) temperature. Moreover, carbon-containing organic fragments produced by the dissociation can result in carbon contamination of the growing crystal. In an effort to circumvent these limitations, a thermal cracker tube can be used with a gas source to crack the source molecules before they reach the substrate. However, in the case of Group V and VI metal-organics, it has been found that the metal atoms recombine within the cracker tube to form dimers and tetramers. Thus, this type of source suffers from the same problem as the thermal effusion cells used in conventional MBE, namely, that it does not produce an atomic beam.

Accordingly, there remains a need for a means to provide a significantly high fraction of monomeric (atomic) species, and to minimize dimeric and tetrameric species in the source beams used for MBE.

SUMMARY OF THE INVENTION

In accordance with the invention, ultraviolet (UV) light is provided for cracking Group V and Group VI dimers and tetramers or, in the case of MOMBE, for the direct cracking of the metal-organic molecules. The UV light interacts with the molecular beam of Group V and Group VI clusters following their generation in an effusion cell or with the metal-organic source. As configured, the source of UV light and associated elements comprise a unit, termed herein a "photo-cracker cell". The photo-cracker cell of the invention may be provided on existing solid source MBE apparatus, between the present effusion cell and the growth chamber in which deposition on a substrate is performed. The photo-cracker cell may also be used effectively in MOMBE applications with equivalent benefits without sacrificing the virtues of the gas source method.

The photo-cracker cell of the invention comprises:

(a) a chamber provided with inlet means and outlet means, the inlet means operatively associated with the effusion source and the outlet means associated with the growth chamber, the inlet means and the outlet means opposite each other in the chamber so as to define a beam path for a beam of molecular species emitted from the effusion source to the growth chamber; and (b) a source of ultraviolet radiation oriented so as to impinge on the beam of molecular species along the beam path, the source of ultraviolet radiation having an intensity sufficient to dissociate the molecular species to atomic species.

The vacuum chamber is provided with an elliptical reflective cavity, with the elliptical reflective cavity defining two foci. The source of ultraviolet radiation (lamp or laser) is located along one focus and the beam path is located along the other focus and substantially parallel thereto.

BRIEF DESCRIPTION OF THE DRAWINGS

FIG. 1 is a perspective view of the photo-cracker cell of the invention, depicting its basic embodiment;

FIG. 2 is a top plan view, schematically depicting the arrangement of the crucial elements of the photo-cracker cell of FIG. 1;

DESCRIPTION OF THE PREFERRED EMBODIMENTS

Figure 3:
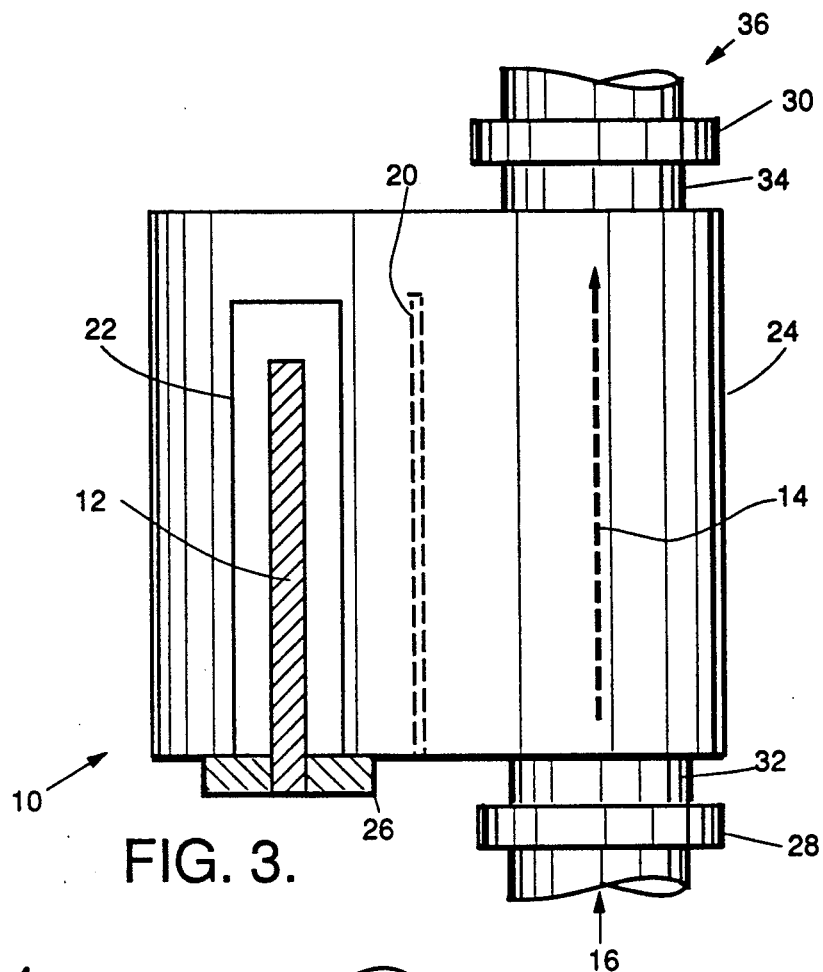
FIG. 3 is a side elevational view, partly in section, of the photo-cracker cell of the invention, depicting its mechanical implementation.

The photo-cracker cell of the invention is a device for producing a monomeric (atomic) beam of Group V or Group VI atoms by photodissociation of the effluent from a conventional thermal effusion cell in MBE, a thermal cracker in gas-source MBE, or parent gas molecules from an injector in MOMBE. The atomic beam thus produced can be used for the growth or doping of semiconductor thin films. The availability of an atomic beam offers distinct advantages over conventional sources in terms of control of the composition and doping of layers grown by MBE, gas-source MBE, and MOMBE.

Currently, MBE gas and solid sources utilize thermal "cracking" in an attempt to dissociate the tetramer and dimer components that are produced by simple molecular effusion sources. However, the generation of monomeric beams of Group V and VI elements by thermal dissociation is very inefficient, and the monomer fraction from such sources is extremely low. In the present invention, UV light is used to photodissociate the output beam from a thermal cell, thereby achieving a very high fractional content of monomeric species in the beam.

As contemplated herein, the Group V species typically comprises arsenic (As) and antimony (Sb), while the Group VI species comprises tellurium (Te) and selenium (Se). However, it will be readily appreciated that the teachings of the present invention are not to be construed as limited to these particular species.

The purpose of the photo-cracker cell of the invention is to generate pure atomic beams, that is, beams of monomeric species, of Group V and VI elements in order to improve the control of composition and doping of semiconductor layers by MBE, gas-source MBE, and MOMBE. This improvement results from the increased sticking coefficient of monomeric species on a semiconductor surface compared to that of dimer or tetramer clusters, and the ability to monitor and control the flux of an atomic beam. The low efficiency of presently-employed thermal cracking of Group V and VI clusters in MBE, gas-source MBE, and MOMBE leads to a large fraction of dimers and tetramers in the beam. This limits the precision of composition and doping control because of the low sticking coefficients of the molecular species and the effects of co-adsorption on the incorporation rate of atoms into the growing layer.

An example is described for the growth of $GaAs_xSb_{1-x}$ using a monomer source for the antimony flux (which has near-unity sticking coefficient). In this application, an antimony flux is established which produces the desired $1-x$ value with respect to the Ga flux. The As flux is then allowed to flood the surface in excess to provide sufficient Group V species to react and combine with the remaining gallium, thus producing the desired alloy. Since the sticking coefficient of atomic Sb is high, virtually all of the Sb flux contributes to layer growth. The As over-pressure provides the remaining Group V species for utilization of the Ga flux, and the excess is re-evaporated (as occurs in conventional GaAs growth, in which an excess As flux is also employed).

The applications for an atomic cracker cell extend from (a) III-V material growth, where the Group V source has a direct influence on growth rate and alloy composition, to (b) Group IV material growth, where Group V elements are used as n-type dopants, and to (c) II-VI growth, where Group VI elements control the composition and Group V elements are dopants. Thus, the potential applications of a monomer source are very diverse.

The basic embodiment of the photo-cracker cell of the present invention is depicted in FIGS. 1-2. The photo-cracker cell 10 utilizes ultraviolet (UV) light from a flashlamp 12 to photodissociate molecular beams 14 comprised of Group V or VI clusters. The photo-cracker cell is positioned in the output stream of a source cell, indicated at 16. By "source cell" is meant a thermal effusion cell in MBE, a thermal cracker cell in gas-source MBE, or a gas injector in MOMBE.

In the embodiment shown in FIGS. 1-2, the flashlamp 12 is placed along one focus of an elliptically-shaped, reflective cavity 18, with the molecular beam path 14 lying along the other focus. The relative placement of the flashlamp 12 and the molecular beam path 14 in the elliptically-shaped, reflective cavity 18 is depicted in FIG. 2.

In this configuration, most of the light emanating from the lamp 12 is collected and focused onto the beam 14 of molecules, and thus the highest photodissociation efficiency can be achieved. One concern is that the flashlamp 12 might gradually become coated with the material from the beam 14 due to the random transverse component of particle velocity following photodissociation. Coating of the lamp 12 due to this effect can be prevented or at least minimized, with little penalty in dissociation efficiency, by interposing a curved, reflective shield 20 between the lamp and the beam path to block the line-of-sight path between the lamp and beam 14. This shield 20 is shown in the perspective drawing of FIG. 1 and the top plan view of FIG. 2.

In the embodiment described, the photo-cracker cell is placed at the end of a thermal effusion cell in MBE, at the end of a thermal cracker cell in gas-source MBE, or at the gas injector of MOMBE. Some modification to the existing apparatus may be required to accommodate the photo-cracker cell in this embodiment; however, in this configuration, the source-to-sample distance is not substantially increased.

Figure 4:
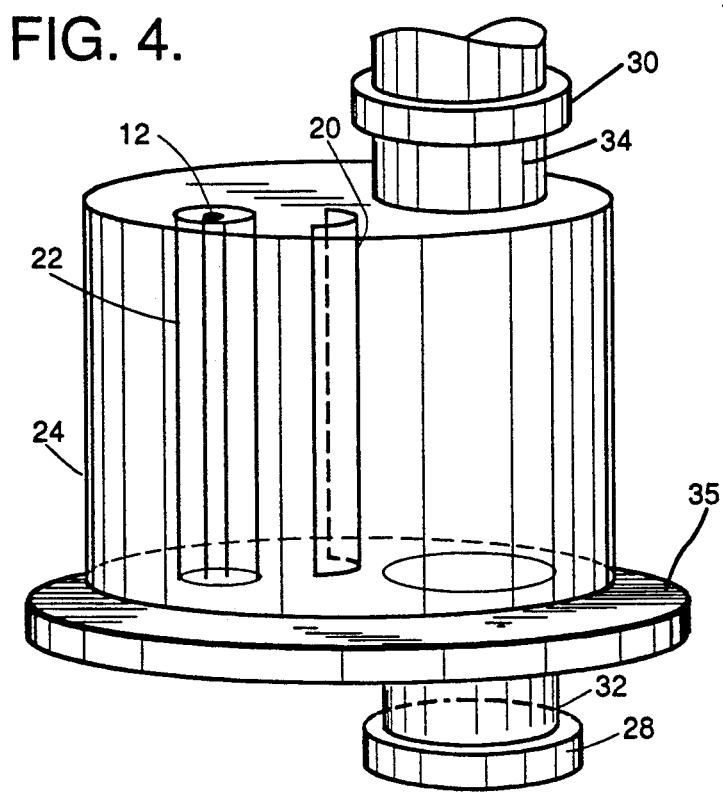
FIG. 4 is a perspective view of the photo-cracker cell of FIG. 3.

FIGS. 3-4 depict a mechanical configuration for the photo-cracker cell of the invention. In this configuration, the flashlamp 12 is housed inside an ultrahigh vacuum (UHV)-compatible quartz tube 22 which is open to air on one end. The quartz tube 22 extends into a vacuum chamber housing 24, through which the beam 14 also passes. This arrangement provides for easy replacement of the lamp 12 without opening the vacuum chamber housing 24 and also facilitates cooling of the lamp with either water or air. The quartz tube 22 is secured to the vacuum chamber 24 by removable means 26.

As shown in FIG. 4, the photo-cracker cell 10 can be built with conventional vacuum flanges 28, 30 near the entrance 32 and exit 34, respectively, thereof, so that it can be conveniently added to any existing MBE, gas-source MBE, or MOMBE system by simply interposing the cell between the growth chamber (shown generally at 36) and an existing source cell 16 (effusion cell, thermal cracker cell, or gas injector). In such an event, the change in geometry may cause a reduction in Group V or Group VI beam flus. However, even if the flux is reduced, the greater efficiency of incorporation obtained using the substantially monomeric beam more than compensates for this tradeoff.

Alternatively, exit portion 34 and flange 30 may be eliminated and replaced by a larger flange 35 at the base of the cell 10, as shown in FIG. 4, for incorporation into the growth chamber, the flange 35 being bolted onto the wall of the growth chamber, and thereby permitting a reduction in the distance between the source and the substrate from that of the configuration immediately described above.

Figure 5:
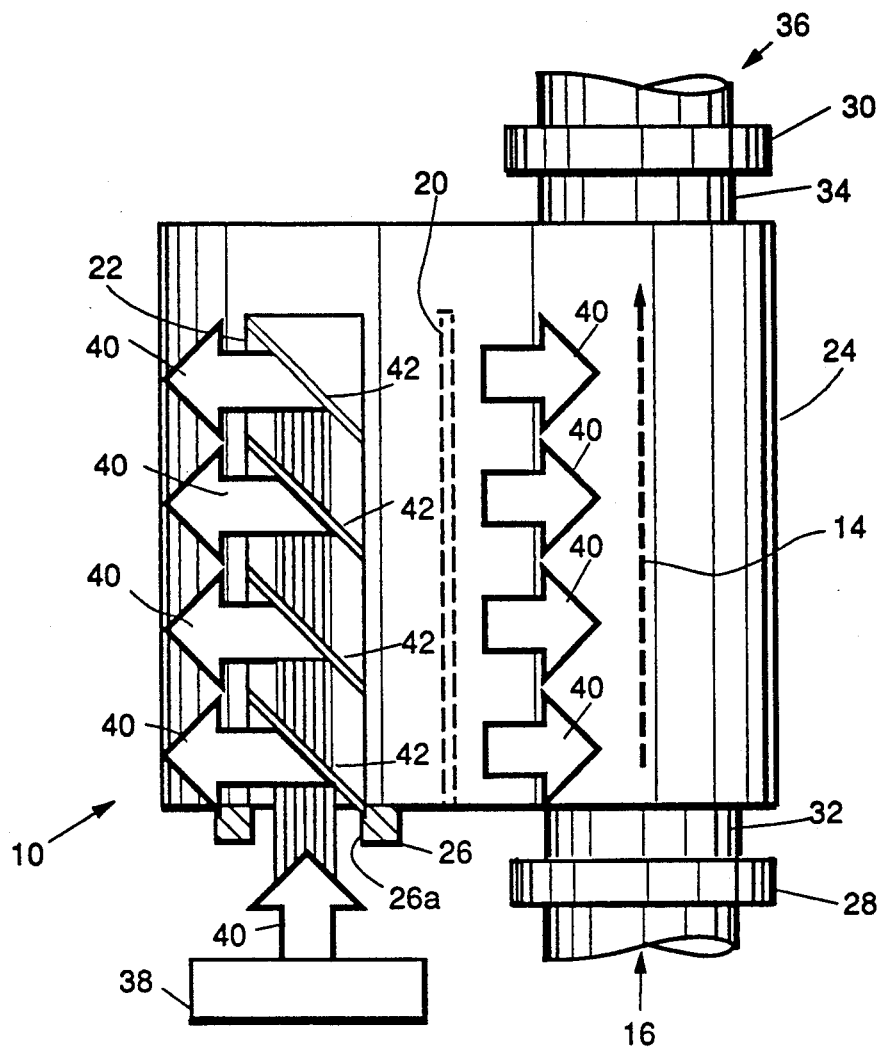
FIG. 5 is a side elevational view, partly in section, of the photo-cracker cell of the invention with the UV lamp replaced by mirrors for accommodation of a UV laser beam.

In an alternate embodiment, depicted in FIG. 5, a UV laser source 38 may be used in place of the flashlamp 12 of FIGS. 1-4, with little modification to the cell design. The UV laser source 38 is positioned outside the vacuum chamber 24, with the UV radiation 40 introduced into the vacuum chamber through an opening 26a at means 26 and distributed into the chamber by a plurality of angled, partially reflecting mirrors 42 (of appropriate reflectivity to ensure substantially uniform irradiation) positioned serially along the length of the quartz tube 22. The angle of the mirrors is off of the line, or axis, defined by the quartz tube 22 and the molecular beam path 14. For example, the mirrors may be 45° off-axis. As above, the UV radiation 40 is reflected by the elliptical cavity 18 to illuminate a substantial portion of the length of the beam 14.

The UV radiation employed is dependent on the molecular species being cracked. For example, cracking $As_4$ (tetramer) to monomeric (atomic) As requires a different wavelength than cracking $As_2$ (dimer) to monomeric As. Thus, while a single wavelength source, such as UV laser 28 may be employed in the practice of the invention, preferably, UV lamp 12, which provides a broader wavelength range, is employed. Such a UV lamp is advantageously a high intensity discharge lamp, and may be continuous or pulsed to provide a sufficiently high photon output to photodissociate substantially all the dimer and tetramer species.

If the UV light source is pulsed, the pulse length must be long enough and the intensity of the photon flux must be high enough to photodissociate substantially all the molecules (i.e., dimers and tetramers) in the irradiated portion of the molecular beam. Further, the repetition rate, or time between pulses, must be short compared to the transit time of the Group V or Group VI species along the beam path 14.

As used herein, the UV wavelength range applicable in the practice of the present invention generally ranges from about 180 to 400 nm.

The highest efficiency of photo-cracking is obtained by providing an elliptical focussing arrangement, as described above, and accordingly, this arrangement is preferred. However, other focussing configurations and even non-focussing configurations may alternatively be employed in accordance with the teachings of this invention.

The beam of Group V or Group VI species that is produced in accordance with the invention is substantially monomeric. By this is meant that whereas thermal cracking produces a beam that, at best, contains about a small fraction of monomeric species, the present invention, employing photo-cracking (UV light), is expected to produce a beam that contains at least about a ten-fold increase in monomeric species.

Thus, there has been disclosed a method and apparatus for the production of substantially monomeric Group V or Group VI metal species. It will be readily apparent to those skilled in this art that various changes and modifications of an obvious nature may be made, and all such changes and modifications are considered to fall within the scope of the invention as defined by the appended claims.

What is claimed is:

1. A photo-cracker cell for placement between a source cell and a growth chamber of apparatus for growth of III-V, IV, and II-VI semiconductor layers, comprising:
    (a) a vacuum chamber provided with inlet means and outlet means, said inlet means operatively associated with said source cell and said outlet means operatively associated with said growth chamber, said inlet means and said outlet means opposite each other in said vacuum chamber so as to define a beam path for a beam of molecular species emitted from said source cell to said growth chamber; and
    (b) a source of ultraviolet radiation oriented so as to impinge on said beam of molecular species along said beam path, said source of ultraviolet radiation having an intensity sufficient to dissociate said molecular species to atomic species.

2. The photo-cracker cell of claim 1 wherein said apparatus comprises molecular beam epitaxy apparatus and said source cell comprises an effusion source.

3. The photo-cracker cell of claim 1 wherein said apparatus comprises gas-source molecular beam epitaxy apparatus and said source cell comprises a thermal cracker cell.

4. The photo-cracker cell of claim 1 wherein said apparatus comprises metal-organic molecular beam epitaxy apparatus and said source cell comprises a gas injector cell.

5. The photo-cracker cell of claim 1 wherein said vacuum chamber is provided with an elliptical reflective cavity, said elliptical reflective cavity defining two foci, with said source of ultraviolet radiation located along one focus and with said beam path located along the other focus and substantially parallel thereto.

6. The photo-cracker cell of claim 5 wherein said source of ultraviolet radiation comprises a UV high intensity lamp.

7. The photo-cracker cell of claim 6 wherein said source of ultraviolet radiation is housed inside an ultrahigh vacuum-compatible quartz tube that extends into said vacuum chamber along said one focus.

8. The photo-cracker cell of claim 6 wherein said source of ultraviolet radiation is oriented substantially parallel to said beam path.

9. The photo-cracker cell of claim 5 further including a reflective shield positioned between said source of ultraviolet radiation and said beam path to reduce coating of said source of ultraviolet radiation with said species.

10. The photo-cracker cell of claim 5 wherein said source of ultraviolet radiation comprises a UV laser.

11. The photo-cracker cell of claim 10 wherein said vacuum chamber includes means for directing a beam emitted by said UV laser along the axis of said molecular beam path.

12. Apparatus for growth of III-V, IV, and II-VI semiconductor layers, said apparatus comprising:
(a) at least one source cell for the generation of a beam of species employed in said growth of said layers;
(b) a growth chamber wherein said growth of said layers occurs; and
(c) a photo-cracker cell interposed between said at least one source cell and said growth chamber, said photo-cracker cell comprising:
(1) a vacuum chamber provided with inlet means and outlet means, said inlet means operatively associated with said source cell and said outlet means operatively associated with said growth chamber, said inlet means and said outlet means opposite each other in said vacuum chamber so as to define a beam path for a beam of molecular species emitted from said source cell to said growth chamber; and
(2) a source of ultraviolet radiation oriented so as to impinge on said beam of molecular species along said beam path.

13. The apparatus of claim 12 wherein said apparatus comprises molecular beam epitaxy apparatus and said source cell comprises an effusion source.

14. The apparatus of claim 12 wherein said apparatus comprises gas-source molecular beam epitaxy apparatus and said source cell comprises a thermal cracker cell.

15. The apparatus of claim 12 wherein said apparatus comprises metal-organic molecular beam epitaxy apparatus and said source cell comprises a gas injector cell.

16. The apparatus of claim 12 wherein said vacuum chamber is provided with an elliptical reflective cavity, said elliptical reflective cavity defining two foci, with said source of ultraviolet radiation located along one focus and with said beam path located along the other focus substantially parallel thereto.

17. The apparatus of claim 16 wherein said source of ultraviolet radiation comprises a UV high intensity lamp.

18. The apparatus of claim 17 wherein said source of ultraviolet radiation is housed inside an ultra-high vacuum-compatible quartz tube that extends into said vacuum chamber along said one focus.

19. The apparatus of claim 17 wherein said source of ultraviolet radiation is oriented substantially parallel to said beam path.

20. The apparatus of claim 16 further including a reflective shield positioned between said source of ultraviolet radiation and said beam path to reduce coating of said source of ultraviolet radiation with said species.

21. The apparatus of claim 16 wherein said source of ultraviolet radiation comprises a UV laser.

22. The apparatus of claim 21 wherein said vacuum chamber includes means for directing a beam emitted by said UV laser along the axis of said molecular beam path.

23. A process for producing substantially monomeric Group V or Group VI species for use in epitaxy growth of III-V, IV, and II-VI semiconductor layers, comprising:
(a) generating a beam of molecular Group V or Group VI species in a source cell;
(b) directing said beam toward a growth chamber for growth of said semiconductor layers; and
(c) exposing said beam to a source of ultraviolet radiation between said source cell and said growth chamber, said source of ultraviolet radiation having an intensity sufficient to photodissociate said molecular species to atomic species.

24. The process of claim 23 wherein said Group V and Group VI species are selected from the group consisting of arsenic, antimony, tellurium, and selenium dimers and tetramers.

25. The process of claim 23 wherein said Group V and Group VI species comprise metal-organic molecules containing an element selected from the group consisting of arsenic, antimony, tellurium, and selenium.

26. The process of claim 23 wherein said beam of molecular species is directed along one focus of an ellipse and said source of radiation positioned at the other focus of said ellipse and focused onto said beam of molecular species.

* * * * *